(12) United States Patent
Komatsu

(10) Patent No.: US 11,908,897 B2
(45) Date of Patent: Feb. 20, 2024

(54) SEMICONDUCTOR DEVICE HAVING TWO-DIMENSIONAL MOSFET

(71) Applicants: Kabushiki Kaisha Toshiba, Tokyo (JP); Toshiba Electronic Devices & Storage Corporation, Tokyo (JP)

(72) Inventor: Kanako Komatsu, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 14 days.

(21) Appl. No.: 17/497,700

(22) Filed: Oct. 8, 2021

(65) Prior Publication Data

US 2022/0045171 A1 Feb. 10, 2022

Related U.S. Application Data

(62) Division of application No. 16/287,002, filed on Feb. 27, 2019, now abandoned.

(30) Foreign Application Priority Data

Sep. 13, 2018 (JP) .................... 2018-171790

(51) Int. Cl.
*H01L 29/08* (2006.01)
*H01L 29/78* (2006.01)

(52) U.S. Cl.
CPC ...... *H01L 29/0882* (2013.01); *H01L 29/0865* (2013.01); *H01L 29/7816* (2013.01)

(58) Field of Classification Search
CPC ............ H01L 27/0211; H01L 29/0882; H01L 27/0266; H01L 29/0847; H01L 29/0865
See application file for complete search history.

(56) References Cited

U.S. PATENT DOCUMENTS

2008/0067615 A1  3/2008  Kim
2009/0050978 A1  2/2009  Ueda
2018/0247892 A1  8/2018  Ikegaya et al.

FOREIGN PATENT DOCUMENTS

| EP | 0766309 A2 | 4/1997 |
| JP | H05-102481 A | 4/1993 |
| JP | H09-107039 A | 4/1997 |
| JP | 2007-273784 A | 10/2007 |
| JP | 2008-078654 A | 4/2008 |
| JP | 2015-038935 A | 2/2015 |
| WO | 2017033642 A1 | 3/2017 |

*Primary Examiner* — Matthew C Landau
*Assistant Examiner* — Mark Hatzilambrou
(74) *Attorney, Agent, or Firm* — Allen & Overy LLP

(57) ABSTRACT

Among multiple drain regions, a contact surface area between second contacts and a drain region most proximal to a central portion of an element region in a second direction is less than a contact surface area between second contacts and a drain region disposed on an outermost side of the element region in the second direction. The multiple drain regions are arranged in the second direction.

6 Claims, 12 Drawing Sheets

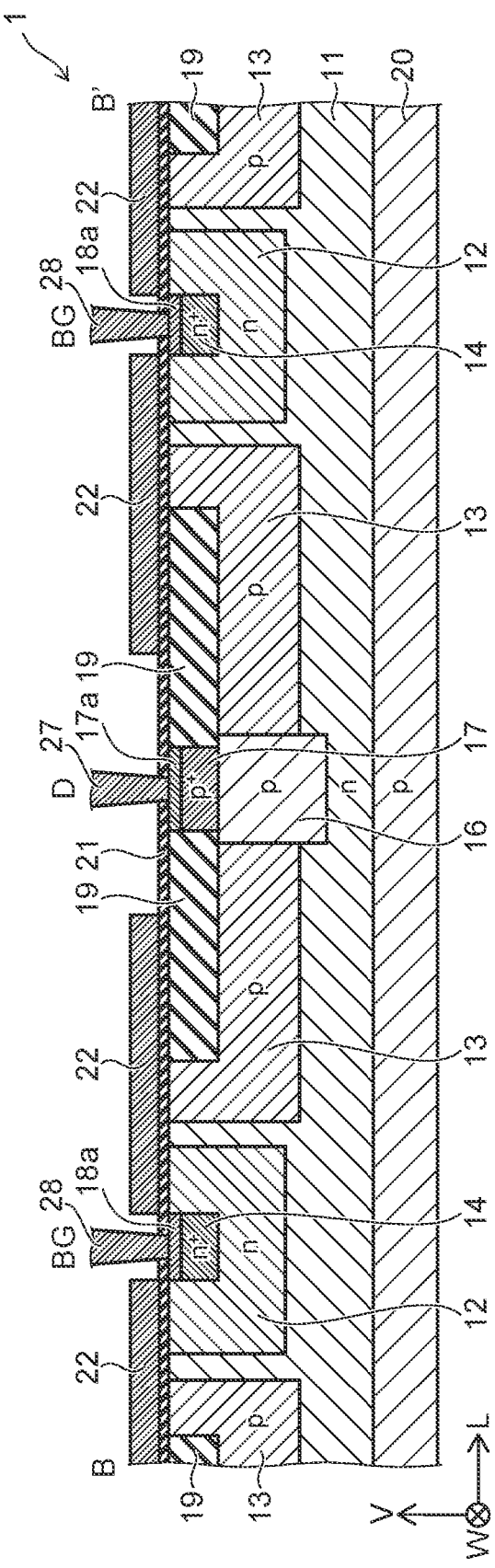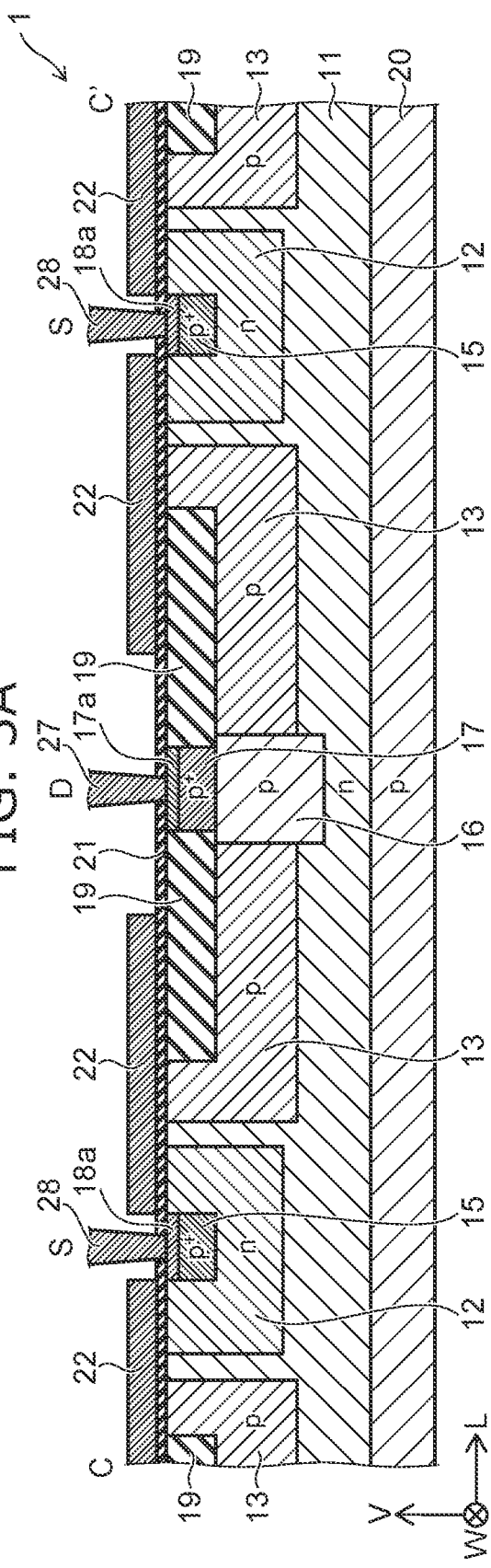

SEMICONDUCTOR DEVICE HAVING TWO-DIMENSIONAL MOSFET

CROSS-REFERENCE TO RELATED APPLICATIONS

This application is a divisional of U.S. application Ser. No. 16/287,002 filed on Feb. 27, 2019 based upon and claims the benefit of priority from Japanese Patent Application No. 2018-171790, filed on Sep. 13, 2018, the entire contents of which are incorporated herein by reference.

FIELD

Embodiments relate to a semiconductor device.

BACKGROUND

As the integration of a semiconductor device is increased, the current density increases; and there is a risk of damage due to an increase of the temperature.

BRIEF DESCRIPTION OF THE DRAWINGS

FIG. 3A is a cross-sectional view along line B-B' shown in FIG. 2; and FIG. 3B is a cross-sectional view along line C-C' shown in FIG. 2;

DETAILED DESCRIPTION

Figure 1:
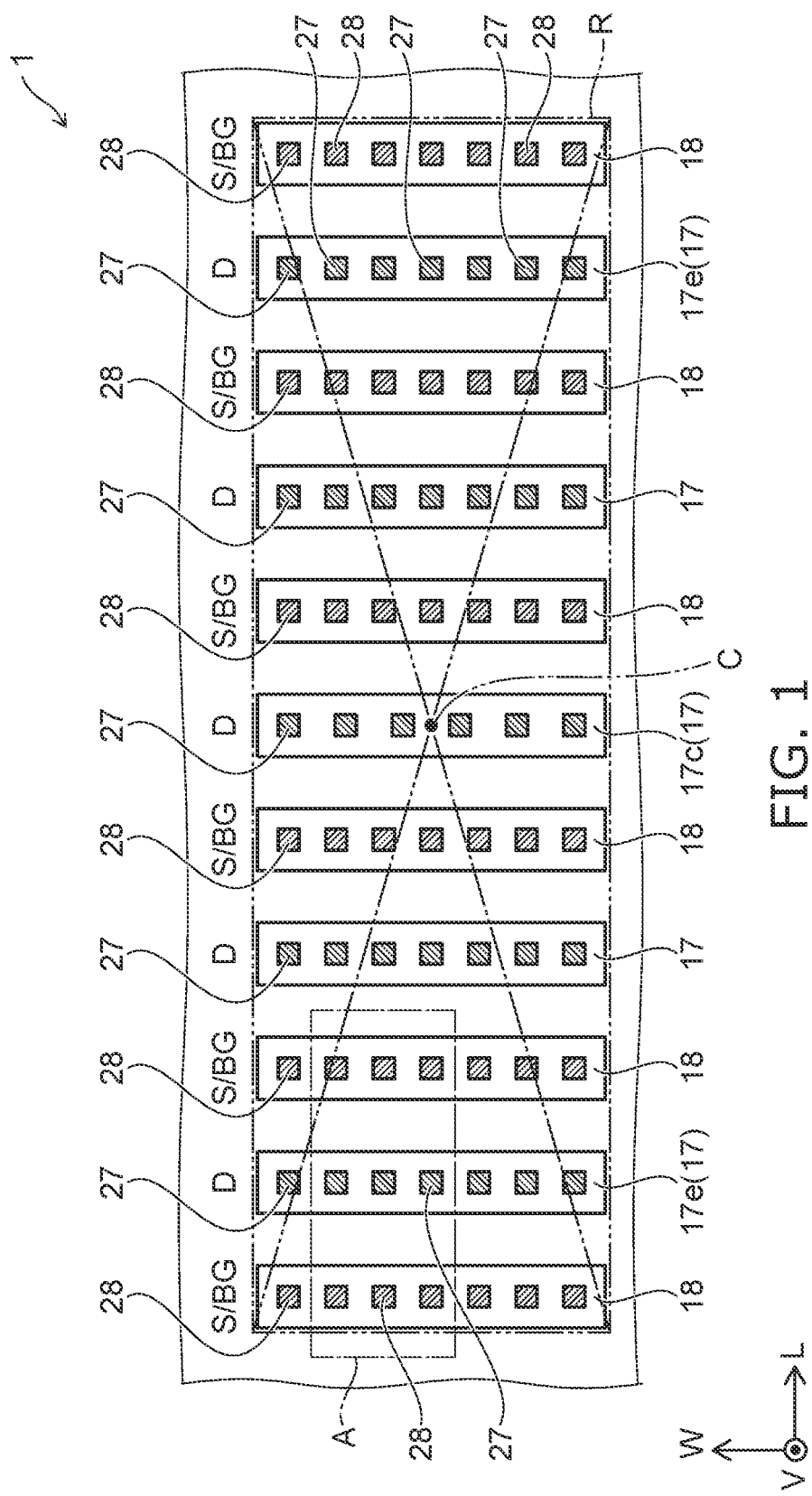
FIG. 1 is a plan view summarily showing a semiconductor device according to a first embodiment.

A semiconductor device according to an embodiment includes a semiconductor layer, a plurality of band-shaped regions, a plurality of drain regions, a gate insulating film, a gate electrode, first contacts, and second contacts; the semiconductor layer is of a first conductivity type; the plurality of band-shaped regions are provided on the semiconductor layer and extend in a first direction; the plurality of drain regions are provided on the semiconductor layer, are separated from the band-shaped regions, extend in the first direction, and are of a second conductivity type; the gate insulating film is provided in a region directly above a region of the semiconductor layer between one of the band-shaped regions and one of the drain regions; the gate electrode is provided on the gate insulating film and extends in the first direction; the first contacts are connected to the band-shaped regions; and the second contacts are connected to the drain regions. Each of the band-shaped regions includes a back gate region of the first conductivity type and a source region of the second conductivity type; an impurity concentration of the back gate region is higher than an impurity concentration of the semiconductor layer; and an impurity concentration of the source region is higher than the impurity concentration of the semiconductor layer. Each of the plurality of band-shaped regions and each of the plurality of drain regions are arranged alternately in a second direction in an element region. Among the plurality of drain regions, a contact surface area between the second contacts and the drain region most proximal to a central portion of the element region in the second direction is less than a contact surface area between the second contacts and the drain region disposed on an outermost side of the element region in the second direction.

Embodiments of the invention will now be described.

In the specification, the "n$^+$-type" indicates that the conductivity type is the n-type, and the impurity concentration is higher than that of the "n-type." Similarly, the "p$^+$-type" indicates that the conductivity type is the p-type, and the impurity concentration is higher than that of the "p-type." The "impurity concentration" refers to the concentration of the effective impurities contributing to the conduction of the semiconductor material, and refers to the portion of the concentration excluding the cancelled portion of the donors and the acceptors in the case where both an impurity that forms donors and an impurity that forms acceptors are included in the semiconductor material.

For easier viewing of the drawings, other than the normal reference numerals in the drawings, the drain is marked with the symbol "D;" the source is marked with the symbol "S;" the back gate is marked with the symbol "BG;" and the band-shaped region is marked with the symbol "S/BG." Further, the gate width direction of the transistor is labeled as "W;" the gate-length direction is labeled as "L;" and the vertical direction is labeled as "V." For example, a gate width direction W, a gate-length direction L, and a vertical direction V are mutually orthogonal. Further, the drawings are schematic and are more simplified than the actual device. The numbers and the dimensional ratios of the components do not always match between the drawings. This is similar for the drawings described below as well.

First Embodiment

FIG. 1 is a plan view summarily showing a semiconductor device according to the embodiment.

Figure 2:
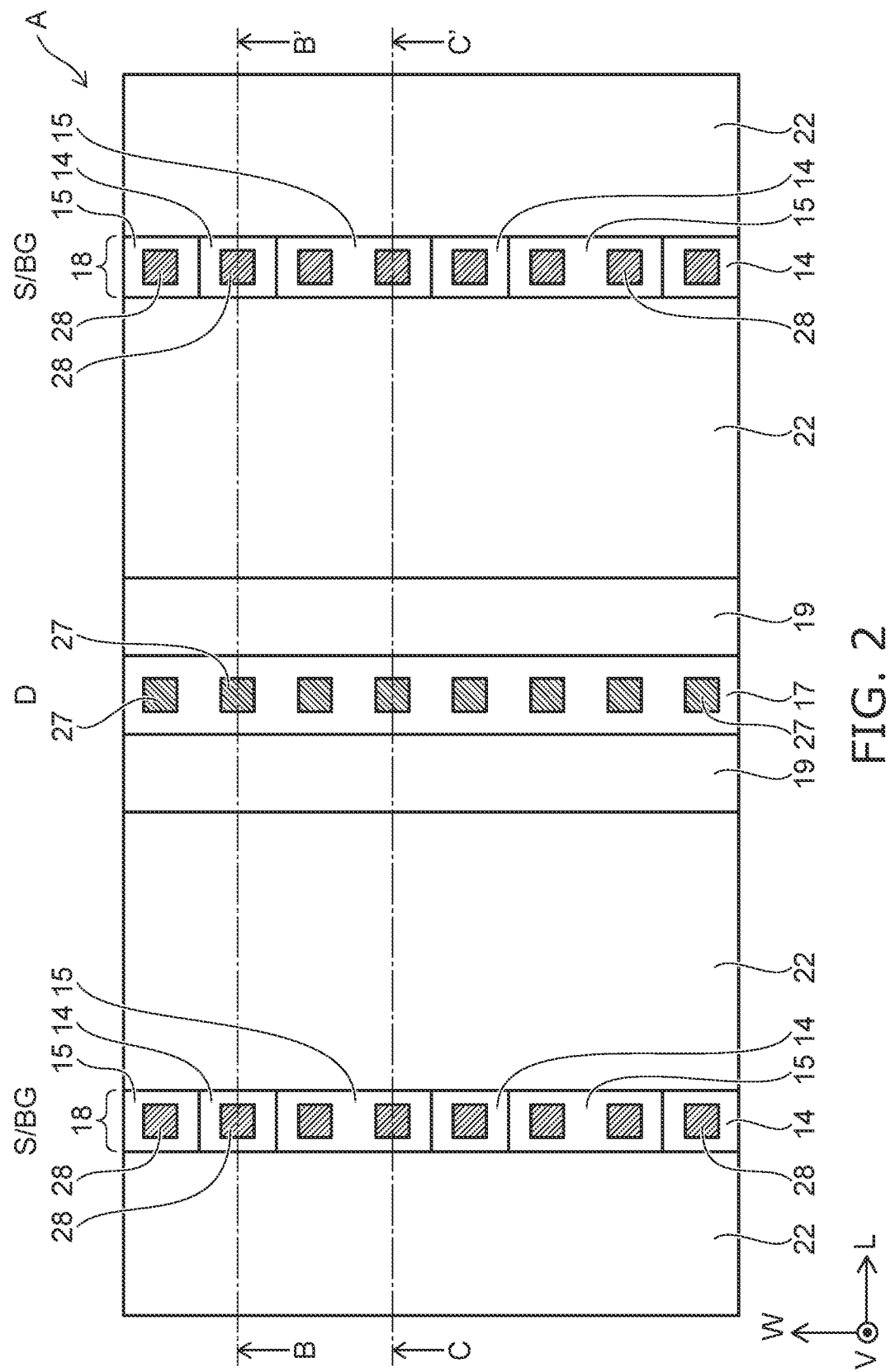
FIG. 2 is a partially enlarged plan view showing region A of FIG. 1.

FIG. 2 is a partially enlarged plan view showing region A of FIG. 1.

FIG. 3A is a cross-sectional view along line B-B' shown in FIG. 2; and FIG. 3B is a cross-sectional view along line C-C' shown in FIG. 2.

First, the configuration of the semiconductor device 1 according to the embodiment will be summarily described.

As shown in FIG. 1, multiple transistors are provided in parallel in the semiconductor device 1. In other words, multiple drain regions 17 that have band configurations extending in the gate width direction W are arranged alternately along the gate-length direction L with multiple band-shaped regions 18 extending in the gate width direction W. Each of the band-shaped regions 18 includes a back gate region 14 (referring to FIG. 2) and a source region 15 (referring to FIG. 2). Then, a transistor is formed in each region between the drain regions 17 and the source regions 15. Hereinbelow, the entire region where the multiple drain regions 17 and the multiple band-shaped regions 18 are arranged alternately is called the "element region R." FIG. 1 shows the element region R with a two-dot chain line. The central portion of the element region R is a portion including the center C of the element region R. In the case that the shape of the element region R is rectangular when viewed from above, the center C is an intersection point of the diagonal lines of the element region R.

Multiple drain contacts 27 are connected to each of the drain regions 17; and multiple source contacts 28 are connected to each of the band-shaped regions 18. Among the multiple drain regions 17, the drain region 17 that is disposed at the central portion in the gate-length direction L is taken as a "drain region 17c;" and the drain regions 17 disposed at the two end portions in the gate-length direction L are taken as "drain regions 17e." The number of the drain contacts 27 connected to the drain region 17c is less than the number of the drain contacts 27 connected to each of the other drain regions 17. The number of the source contacts 28 connected to the band-shaped region 18 is the same for each of the band-shaped regions 18.

The configuration of the semiconductor device 1 will now be described in detail.

For example, in the semiconductor device 1 as shown in FIG. 2 and FIGS. 3A and 3B, an n-type deep n-well 11 is provided on a p-type silicon substrate 20. An n-type well 12 and a p-type drift region 13 are provided to be separated from each other in the upper layer portion of the deep n-well 11. The n-type well 12 and the p-type drift region 13 may contact each other. The n-type well 12 and the p-type drift region 13 are arranged alternately along the gate-length direction L; and each extends in the gate width direction W. The n-type deep n-well 11 and the n-type well 12 form a semiconductor layer of the n-type.

The $n^+$-type back gate region 14 and the $p^+$-type source region 15 are provided in the upper layer portion of the n-type well 12. The back gate region 14 and the source region 15 are arranged alternately in one column along the gate width direction W and contact each other. The band-shaped region 18 that extends in the gate width direction W is formed of the back gate regions 14 and the source regions 15 arranged in the one column. In the gate width direction W, the length of each of the source regions 15 is longer than, e.g., about 2 times the length of each of the back gate regions 14.

A silicide layer 18a is formed in the uppermost layer portion of the band-shaped region 18. The back gate region 14 and the source region 15 are connected to each other directly and via the silicide layer 18a.

On the other hand, a p-type well 16 that extends in the gate width direction W is provided in the central portion in the gate-length direction L of the p-type drift region 13. The p-type well 16 contacts the p-type drift region 13. The $p^+$-type drain region 17 that extends in the gate width direction W is provided on the p-type well 16. A silicide layer 17a is formed in the uppermost layer of the drain region 17.

STI (Shallow Trench Isolation (an element-separating insulating film)) 19 is provided on a portion of the p-type drift region 13 other than the end portion opposing the n-type well 12. The STI 19 is provided between the drain region 17 and the band-shaped region 18, contacts the drain region 17, but does not contact the band-shaped region 18.

A gate insulating film 21 is provided on the n-type well 12, the p-type drift region 13, and the portion of the deep n-well 11 interposed between the n-type well 12 and the p-type drift region 13. The gate insulating film 21 is not illustrated in FIG. 2.

A gate electrode 22 that extends in the gate width direction W is provided on the gate insulating film 21. The gate electrode 22 is provided over the n-type well 12, the p-type drift region 13, the STI 19, and the portion of the deep n-well 11 interposed between the n-type well 12 and the p-type drift region 13. The gate electrode 22 is disposed at least in a region directly above a portion of the semiconductor layer located between the p-type drift region 13 and the band-shaped region 18.

The source contacts 28 are provided on the band-shaped region 18 and are connected to the back gate region 14 and the source region 15 via the silicide layer 18a. The drain contacts 27 are provided on the drain region 17 and are connected to the drain region 17 via the silicide layer 17a.

Effects of the embodiment will now be described.

In the semiconductor device 1 as described above, the number of the drain contacts 27 connected to the drain region 17c disposed at the central portion in the gate-length direction L is less than the number of the drain contacts 27 connected to each of the other drain regions 17. On the other hand, the surface area where each of the drain contacts 27 contacts the drain region 17 is substantially the same. Therefore, the contact surface area between the drain contacts 27 and the drain region 17c of the central portion is less than the contact surface areas between the drain contacts 27 and the other drain regions 17. For example, the contact surface area between the drain region 17c and the drain contacts 27 is less than the contact surface area between the drain contacts 27 and the drain region 17e disposed on the outermost side.

Thereby, the on-current that flows between the drain region 17c and the source regions 15 disposed on the two sides of the drain region 17c is smaller than the on-current flowing in each of the other drain regions 17. As a result, in the element region R, the heat generation that is caused by the on-current is smaller in the central portion in the gate-length direction L than in each of the other portions.

Generally, in the element region R, cooling is not performed easily and the temperature increases easily proximal to the central portion. According to the embodiment, the temperature increase at the central portion can be suppressed by suppressing the heat generation by reducing the on-current at the central portion of the element region R. As a result, the temperature distribution inside the element region R can be uniform; and the heat resistance of the semiconductor device 1 as an entirety can be improved.

Because the source contacts 28 are disposed equally between the band-shaped regions 18, the contact surface area between each of the band-shaped regions 18 and the source contacts 28 is substantially equal between the band-shaped regions 18. Thereby, the transistors can be turned on substantially uniformly in the case where ESD (Electrostatic Discharge) is input to the source contacts 28. Therefore, the semiconductor device 1 also is suited to applications in which there is a possibility of ESD being applied to the source.

Second Embodiment

Figure 4:
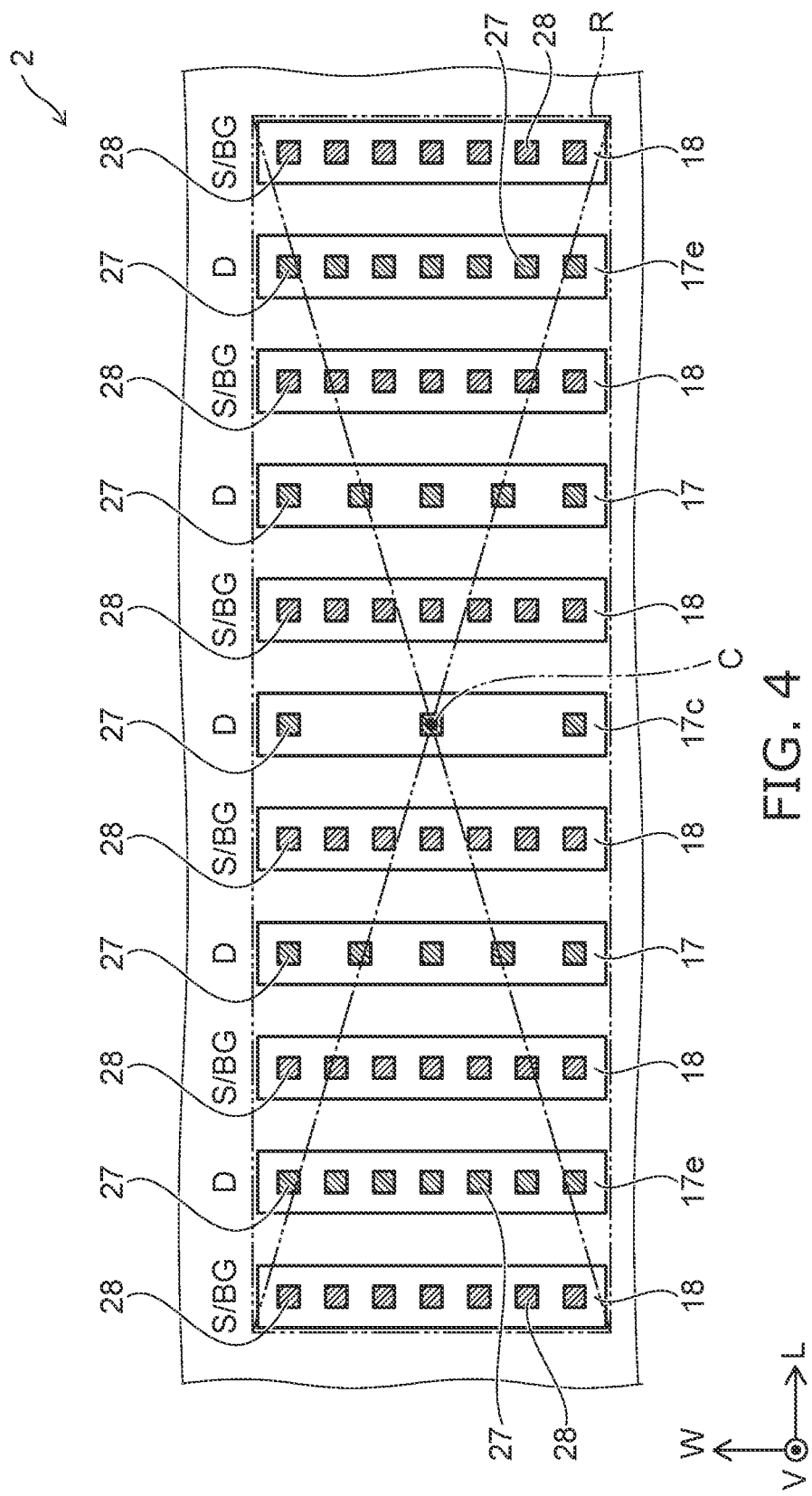
FIG. 4 is a plan view summarily showing a semiconductor device according to a second embodiment.

FIG. 4 is a plan view summarily showing a semiconductor device according to the embodiment.

In the semiconductor device 2 according to the embodiment as shown in FIG. 4, the number of the drain contacts 27 connected to the drain region 17 changes consecutively between the drain regions 17; and the number of the drain contacts 27 connected to the drain region 17 is fewer for the drain regions 17 more proximal to the central portion in the gate-length direction L of the element region. Therefore, the contact surface area between the drain region 17 and the drain contacts 27 is smaller for the drain regions 17 more proximal to the central portion in the gate-length direction L of the element region.

According to the embodiment, because the number of the drain contacts 27 changes consecutively along the gate-length direction L, the heat generation amount can be changed consecutively; and the temperature distribution can be made uniform with higher precision. Otherwise, the configuration and the effects of the embodiment are similar to those of the first embodiment described above.

Third Embodiment

Figure 5:
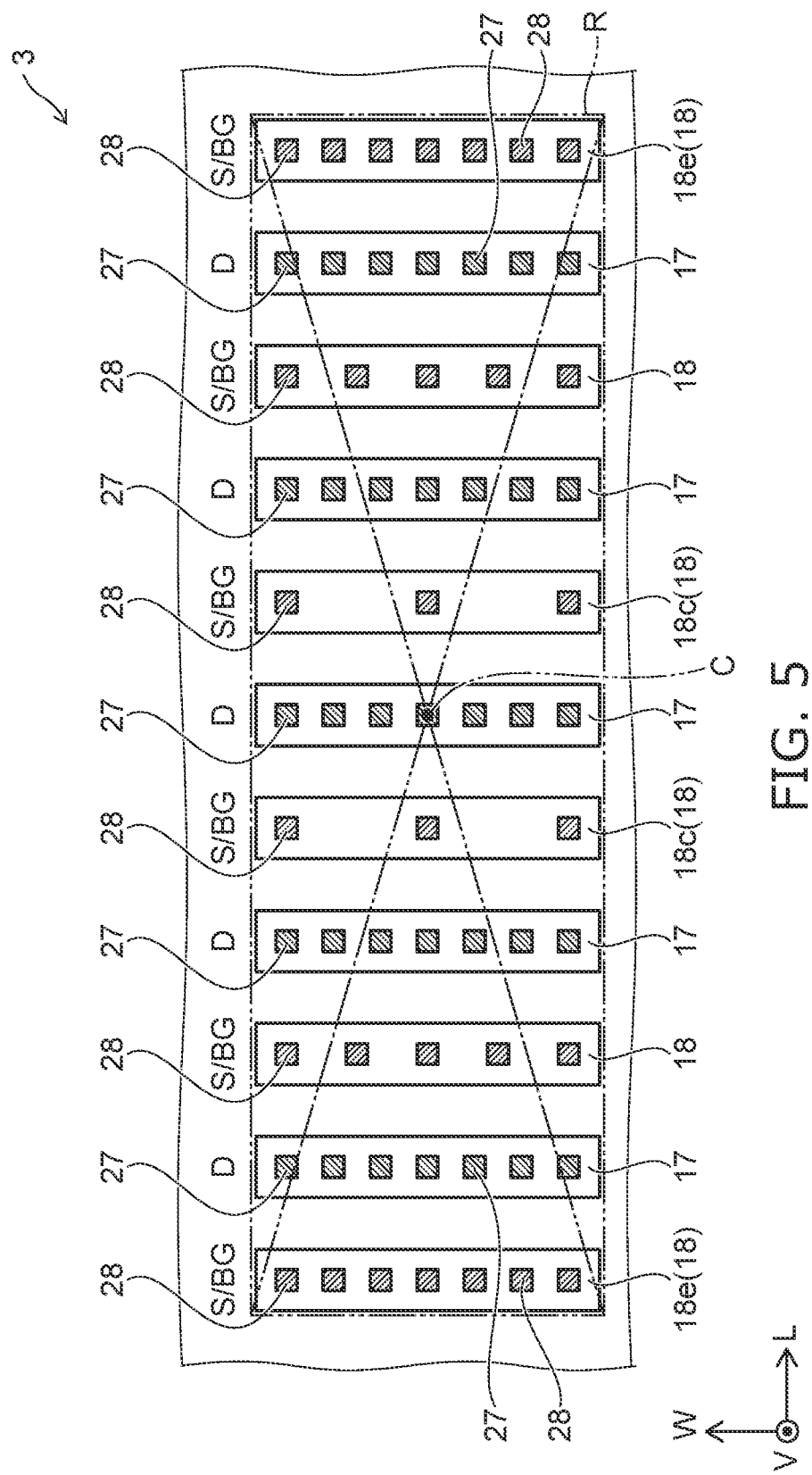
FIG. 5 is a plan view summarily showing a semiconductor device according to a third embodiment.

FIG. 5 is a plan view summarily showing a semiconductor device according to the embodiment.

In the semiconductor device 3 according to the embodiment as shown in FIG. 5, the number of the drain contacts 27 connected to each of the drain regions 17 is the same; and the number of the source contacts 28 connected to each of the band-shaped regions 18 is different according to the position of the band-shaped region 18. Specifically, in the element region, the number of the source contacts 28 connected to the band-shaped region 18 is fewer for the band-shaped regions 18 more proximal to the central portion in the gate-length direction L. Therefore, the contact surface area between the band-shaped region 18 and the source contacts 28 is smaller for the band-shaped regions 18 more proximal to the central portion in the gate-length direction L of the element region. For example, the contact surface area between the source contacts 28 and a band-shaped region 18c most proximal to the central portion in the gate-length direction L of the element region is less than the contact surface area between the source contacts 28 and band-shaped regions 18e disposed at the two end portions in the gate-length direction L of the element region.

According to the embodiment as well, the current amount at the central portion in the gate-length direction L of the element region can be reduced; and the temperature distribution can be uniform. Also, the embodiment is favorable for applications in which there is a possibility of ESD being applied to the drain because the number of the drain contacts 27 is constant. Otherwise, the configuration and the effects of the embodiment are similar to those of the first embodiment described above.

Fourth Embodiment

Figure 6:
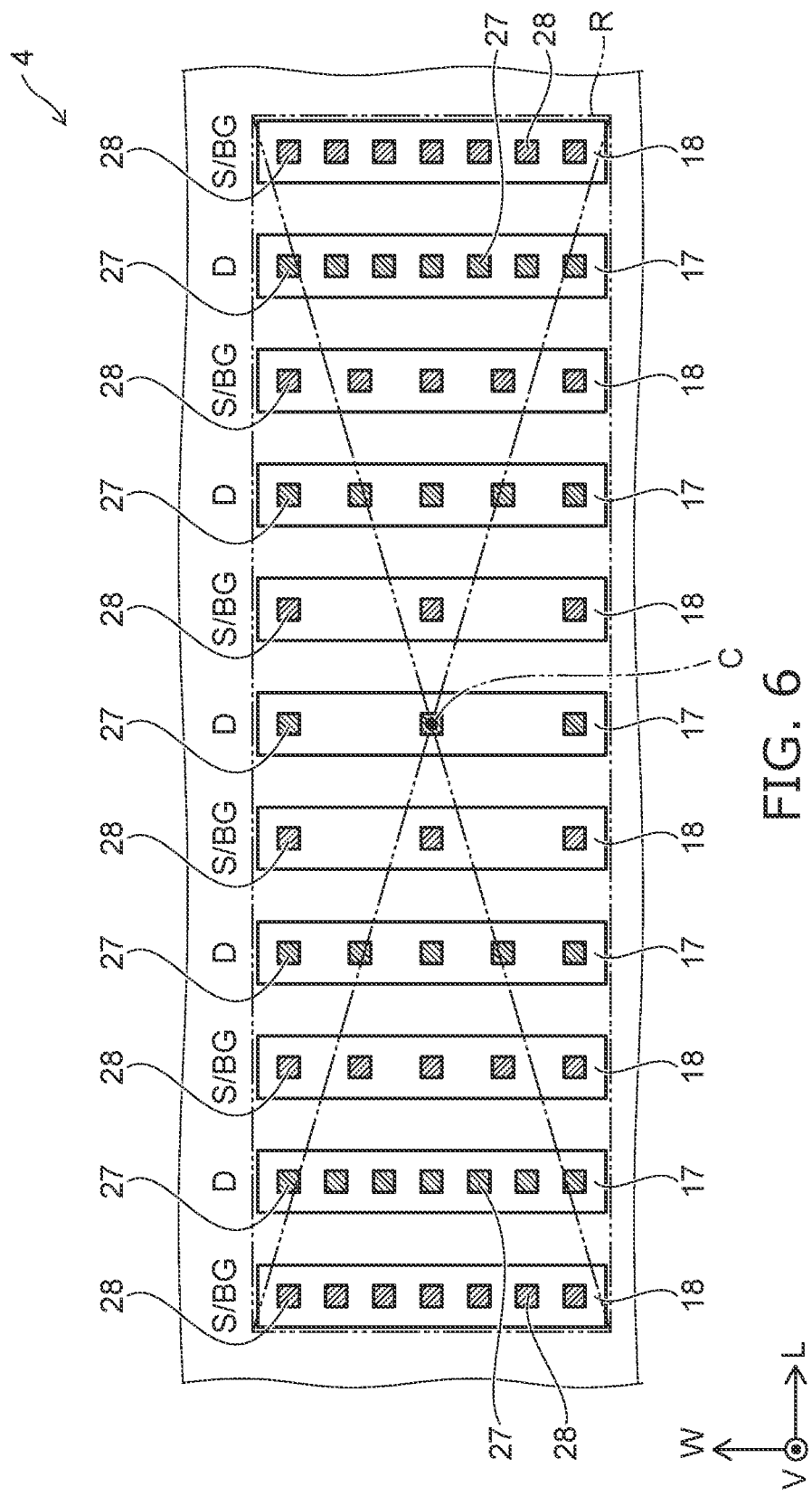
FIG. 6 is a plan view summarily showing a semiconductor device according to a fourth embodiment.

FIG. 6 is a plan view summarily showing a semiconductor device according to the embodiment.

As shown in FIG. 6, the number of the drain contacts 27 and the number of the source contacts 28 both change in the semiconductor device 4 according to the embodiment. Specifically, the number of the drain contacts 27 connected to the drain region 17 is fewer for the drain regions 17 more proximal to the central portion in the gate-length direction L of the element region; and similarly, the number of the source contacts 28 connected to the band-shaped region 18 is fewer for the band-shaped regions 18 more proximal to the central portion in the gate-length direction L of the element region.

According to the embodiment as well, the current amount at the central portion in the gate-length direction L of the element region can be reduced; and the temperature distribution can be uniform. Otherwise, the configuration and the effects of the embodiment are similar to those of the first embodiment described above.

Fifth Embodiment

Figure 7:
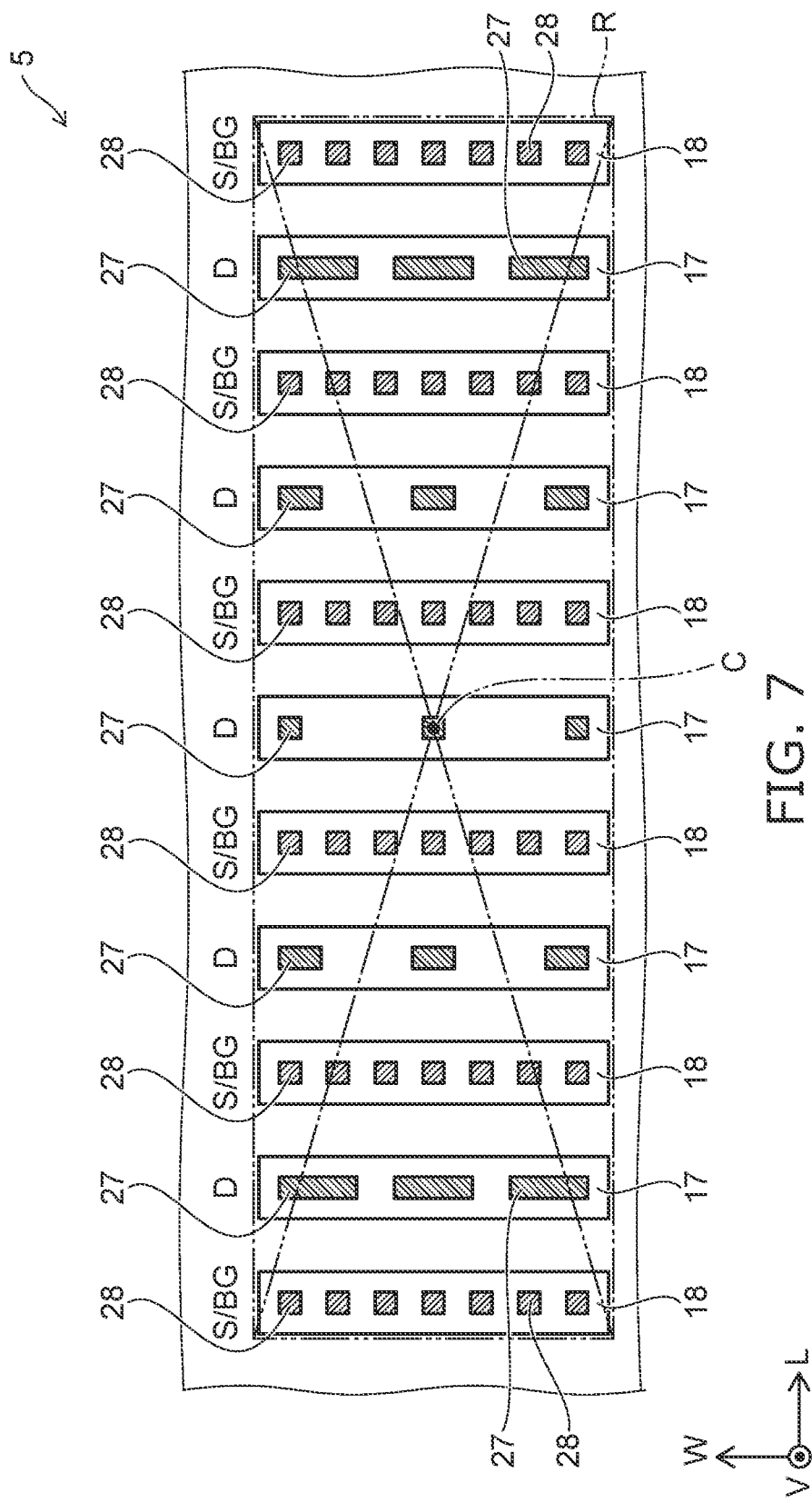
FIG. 7 is a plan view summarily showing a semiconductor device according to a fifth embodiment.

FIG. 7 is a plan view summarily showing a semiconductor device according to the embodiment.

In the semiconductor device 5 according to the embodiment as shown in FIG. 7, the configuration of the drain contact 27 when viewed from the vertical direction V is different according to the position of the drain region 17 connected to the drain contact 27.

Specifically, the length in the gate width direction W is shorter and the contact surface area between the drain region 17 and the drain contact 27 is smaller for the drain contacts 27 connected to the drain regions 17 more proximal to the central portion in the gate-length direction L of the element region. The number of the drain contacts 27 connected to the drain region 17 is the same for each of the drain regions 17. Therefore, the contact surface area between the drain region 17 and the drain contacts 27 is smaller for the drain regions 17 more proximal to the central portion in the gate-length direction L of the element region.

On the other hand, the configuration of the source contact 28 connected to the band-shaped region 18 is substantially the same for each of the band-shaped regions 18; and the number of the source contacts 28 connected to the band-shaped region 18 also is the same for each of the band-shaped regions 18. Therefore, the contact surface area between each of the band-shaped regions 18 and the source contacts 28 is substantially equal between the band-shaped regions 18.

According to the embodiment as well, the temperature distribution can be made uniform by suppressing the heat generation amount by reducing the current amount proximal to the central portion in the gate-length direction L of the element region. As a result, the heat resistance of the semiconductor device 5 can be improved. Otherwise, the configuration and the effects of the embodiment are similar to those of the first embodiment described above.

Sixth Embodiment

Figure 8:
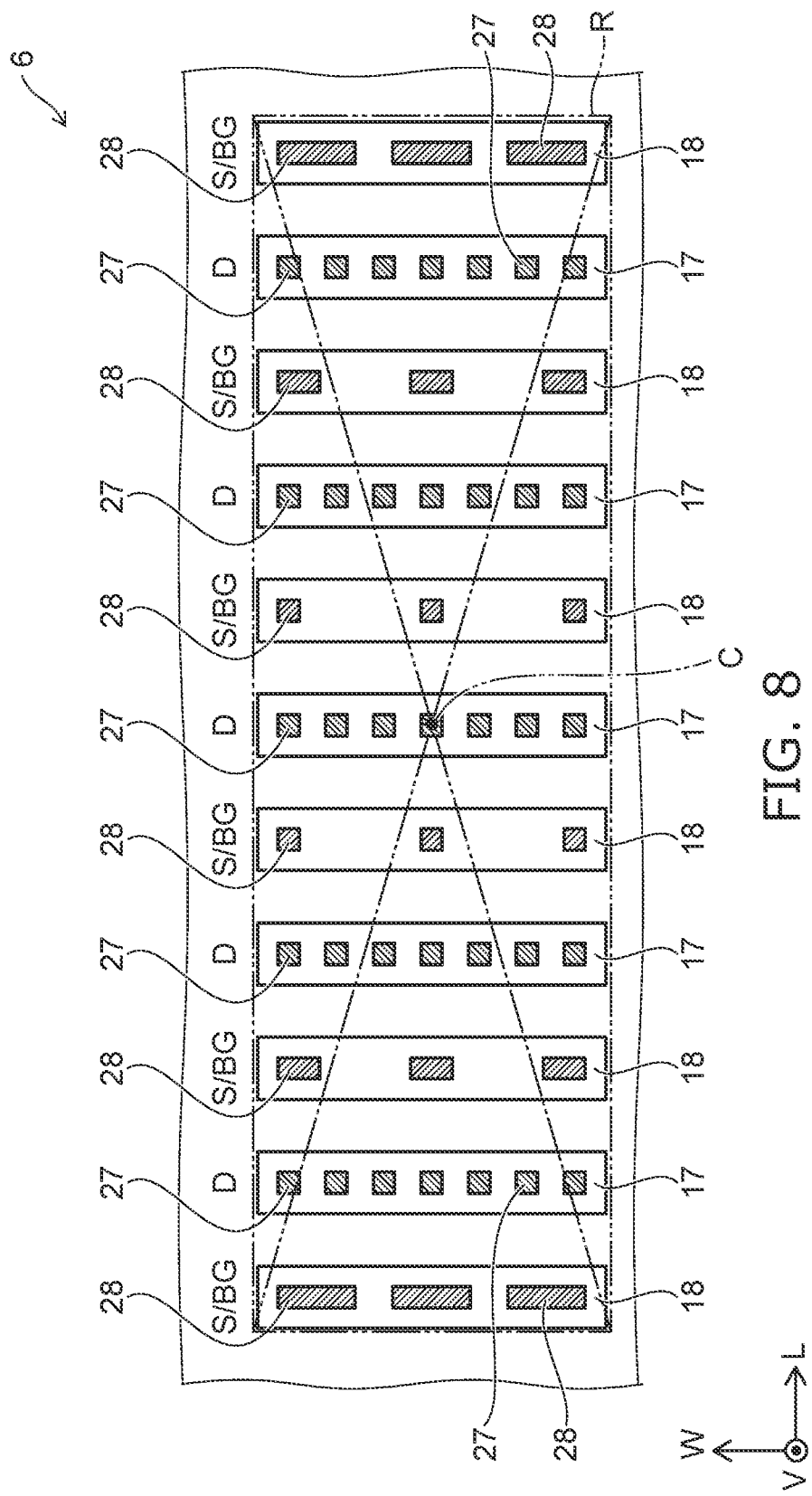
FIG. 8 is a plan view summarily showing a semiconductor device according to a sixth embodiment.

FIG. 8 is a plan view summarily showing a semiconductor device according to the embodiment.

The embodiment is an example in which the third embodiment and the fifth embodiment described above are combined.

In the semiconductor device 6 according to the embodiment as shown in FIG. 8, the configuration of the source contact 28 when viewed from the vertical direction V is different according to the position of the band-shaped region 18 connected to the source contact 28.

Specifically, the length in the gate width direction W is shorter and the contact surface area between the band-shaped region 18 and the source contact 28 is smaller for the source contacts 28 connected to the band-shaped regions 18 more proximal to the central portion in the gate-length direction L of the element region. The number of the source contacts 28 connected to the band-shaped region 18 is the same for each of the band-shaped regions 18. Therefore, the contact surface area between the source contacts 28 and the band-shaped region 18 is smaller for the band-shaped regions 18 more proximal to the central portion in the gate-length direction L of the element region.

On the other hand, the configuration of the drain contact 27 connected to the drain region 17 is substantially the same for each of the drain regions 17; and the number of the drain contacts 27 connected to the drain region 17 also is the same for each of the drain regions 17. Therefore, the contact surface area between each of the drain regions 17 and the drain contacts 27 is substantially equal between the drain regions 17. Otherwise, the configuration and the effects of the embodiment are similar to those of the first embodiment described above.

Seventh Embodiment

Figure 9:
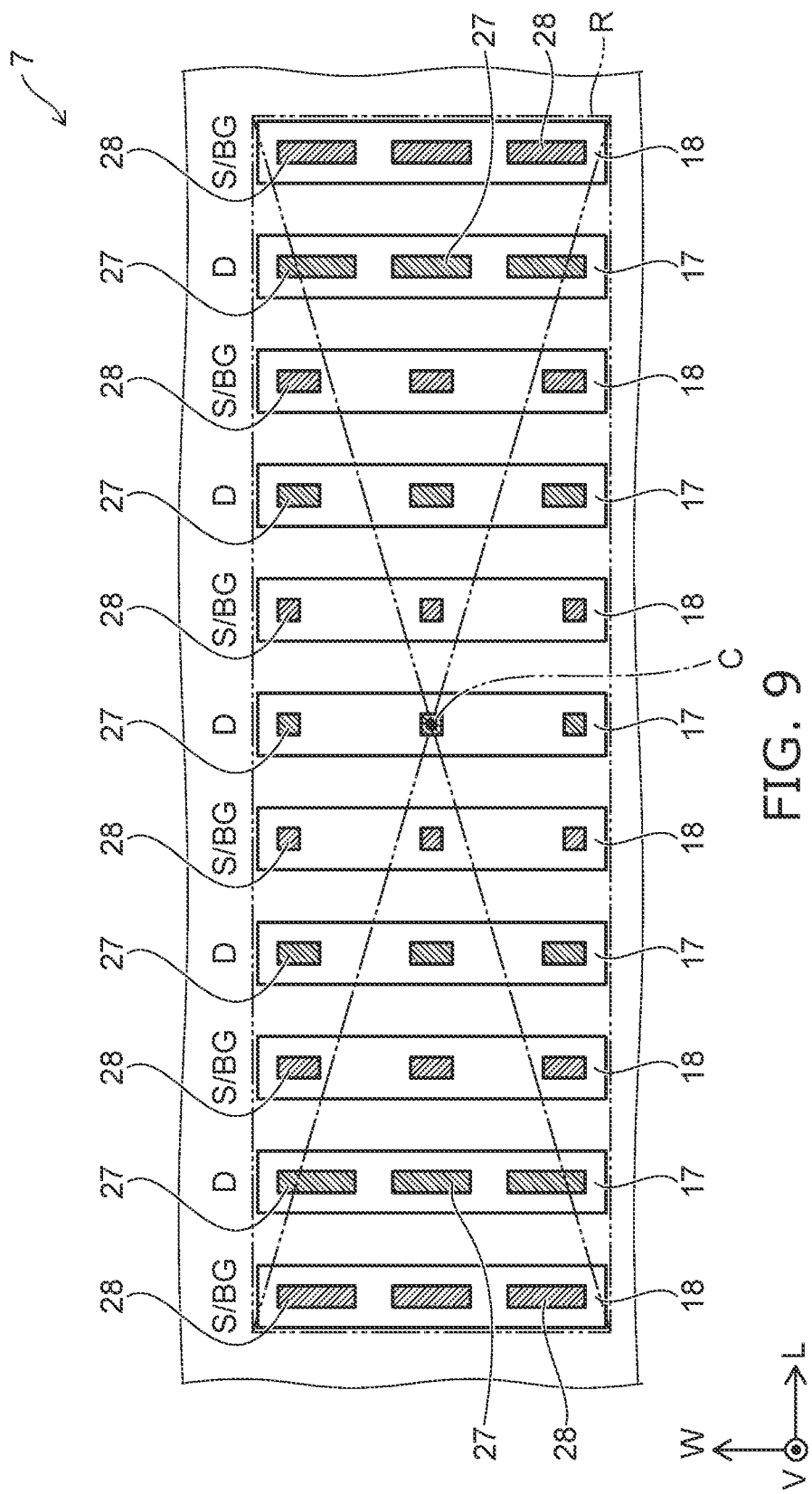
FIG. 9 is a plan view summarily showing a semiconductor device according to a seventh embodiment.

FIG. 9 is a plan view summarily showing a semiconductor device according to the embodiment.

The embodiment is an example in which the fourth embodiment and the fifth embodiment described above are combined.

In the semiconductor device 7 according to the embodiment as shown in FIG. 9, the configuration of the drain contact 27 and the configuration of the source contact 28 when viewed from the vertical direction V both are different according to the position of the drain region 17 or the band-shaped region 18 connected to the drain contact 27 or the source contact 28. The number of the drain contacts 27 connected to the drain region 17 is the same for each of the drain regions 17; and the number of the source contacts 28 connected to the band-shaped region 18 also is the same for each of the band-shaped regions 18.

Specifically, the length in the gate width direction W is shorter for the drain contacts 27 connected to the drain regions 17 more proximal to the central portion in the gate-length direction L of the element region. Similarly, the length in the gate width direction W is shorter for the source contacts 28 connected to the band-shaped regions 18 more proximal to the central portion in the gate-length direction L of the element region. Therefore, the contact surface area between the drain region 17 and the drain contacts 27 is smaller for the drain regions 17 more proximal to the central portion in the gate-length direction L of the element region; and the contact surface area between the band-shaped region 18 and the source contacts 28 is smaller for the band-shaped regions 18 more proximal to the central portion in the gate-length direction L of the element region. Otherwise, the configuration and the effects of the embodiment are similar to those of the first embodiment described above.

Eighth Embodiment

Figure 10:
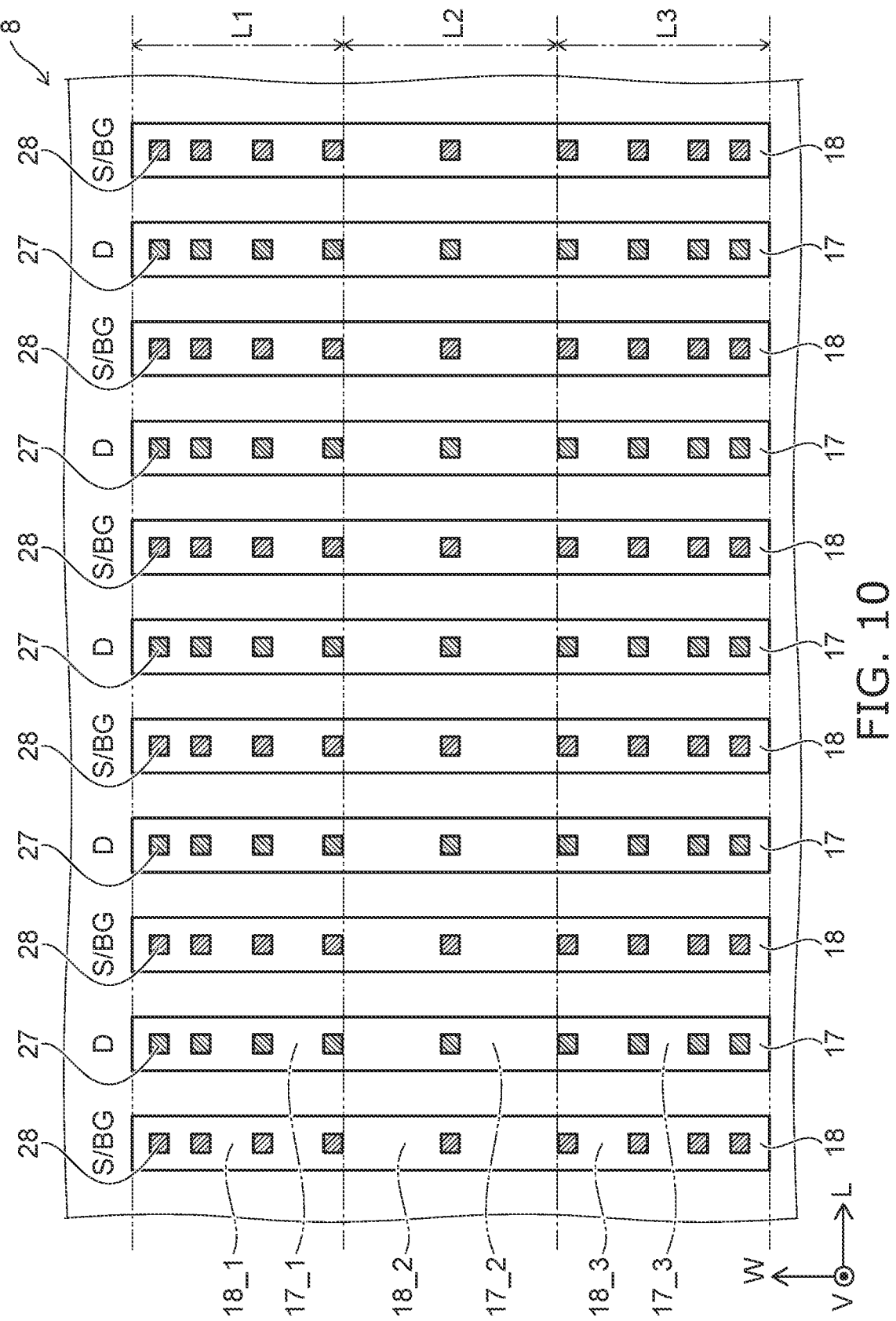
FIG. 10 is a plan view summarily showing a semiconductor device according to an eighth embodiment.

FIG. 10 is a plan view summarily showing a semiconductor device according to the embodiment.

In the semiconductor device 8 according to the embodiment as shown in FIG. 10, the arrangement densities of the drain contacts 27 and the source contacts 28 are different not in the gate-length direction L but in the gate width direction W. In other words, in each of the drain regions 17, the arrangement density of the drain contacts 27 connected to the central portion in the gate width direction W is lower than the arrangement densities of the drain contacts 27 connected to the two end portions in the gate width direction W. Similarly, in each of the band-shaped regions 18, the arrangement density of the source contacts 28 connected to the central portion in the gate width direction W is lower than the arrangement densities of the source contacts 28 connected to the two end portions in the gate width direction W.

For example, the characteristics described above can be specified as follows.

Each of the drain regions 17 is taken as being subdivided into three imaginary regions along the gate width direction W, i.e., an end region 17_1, a central region 17_2, and an end region 17_3. The central region 17_2 is disposed between the end region 17_1 and the end region 17_3 in the gate width direction W. In the gate width direction W, a length L1 of the end region 17_1, a length L2 of the central region 17_2, and a length L3 of the end region 17_3 are equal to each other. In other words, L1=L2=L3.

In such a case, the number of the drain contacts 27 connected to the central region 17_2 is less than the number of the drain contacts 27 connected to the end region 17_1 and the number of the drain contacts 27 connected to the end region 17_3. The surface area where each of the drain contacts 27 contacts the drain region 17 is substantially equal between the drain contacts 27. Accordingly, the contact surface area between the central region 17_2 and the drain contacts 27 is less than the contact surface area between the end region 17_1 and the drain contacts 27 and the contact surface area between the end region 17_3 and the drain contacts 27.

Similarly, each of the band-shaped regions 18 is taken as being subdivided into three imaginary regions along the gate width direction W, i.e., an end region 18_1, a central region 18_2, and an end region 18_3. The central region 18_2 is disposed between the end region 18_1 and the end region 18_3 in the gate width direction W. In the gate width direction W, a length L1 of the end region 18_1, a length L2 of the central region 18_2, and a length L3 of the end region 18_3 are equal to each other.

In such a case, the number of the source contacts 28 connected to the central region 18_2 is less than the number of the source contacts 28 connected to the end region 18_1 and the number of the source contacts 28 connected to the end region 18_3. The surface area where each of the source contacts 28 contacts the band-shaped region 18 is substantially equal between the source contacts 28. Accordingly, the contact surface area between the central region 18_2 and the source contacts 28 is less than the contact surface area between the end region 18_1 and the source contacts 28 and the contact surface area between the end region 18_3 and the source contacts 28.

Effects of the embodiment will now be described.

According to the embodiment, in the gate width direction W, the on-current at the central portion can be smaller than the on-currents at the two end portions; and the heat generation amount can be suppressed. Thereby, the temperature distribution in the element region can be uniform. As a result, the heat resistance of the semiconductor device 8 as an entirety can be improved. Otherwise, the configuration and the effects of the embodiment are similar to those of the first embodiment described above.

Ninth Embodiment

Figure 11:
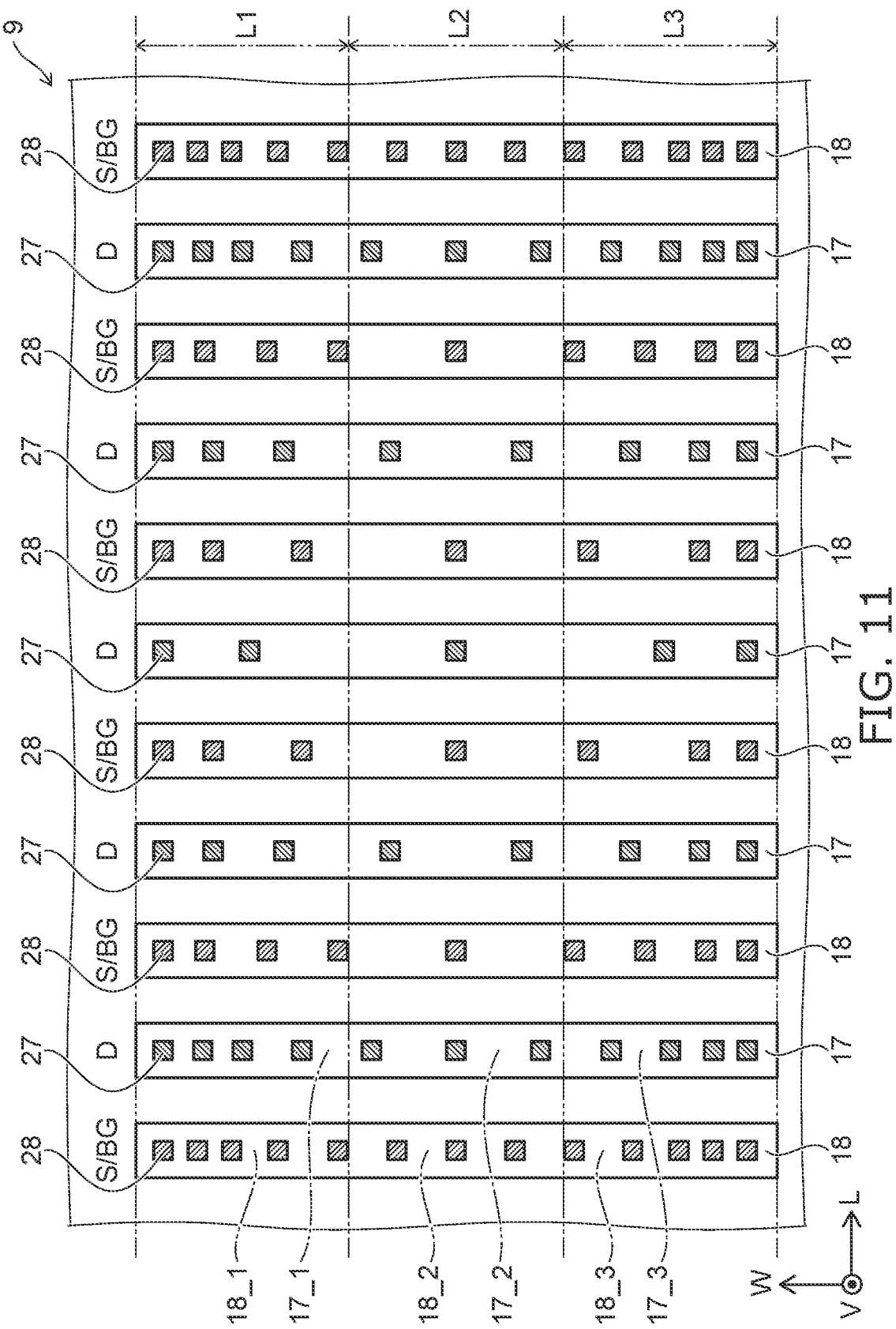
FIG. 11 is a plan view summarily showing a semiconductor device according to a ninth embodiment.

FIG. 11 is a plan view summarily showing a semiconductor device according to the embodiment.

The embodiment is an example in which the fourth embodiment and the eighth embodiment described above are combined.

In the semiconductor device 9 according to the embodiment as shown in FIG. 11, the arrangement densities of the drain contacts 27 and the source contacts 28 are different in both the gate-length direction L and the gate width direction W.

In other words, among the multiple drain regions 17 included in the element region, the number of the drain contacts 27 connected to the drain region 17 is fewer and the contact surface area between the drain region 17 and the drain contacts 27 is smaller for the drain regions 17 more proximal to the central portion in the gate-length direction L. Also, in each of the drain regions 17, the arrangement density of the drain contacts 27 is lower and the contact surface area between the drain region 17 and the drain contacts 27 is smaller more proximal to the central portion in the gate width direction W.

Similarly, among the multiple band-shaped regions 18 included in the element region, the number of the source contacts 28 connected to the band-shaped region 18 is fewer and the contact surface area between the band-shaped region 18 and the source contacts 28 is smaller for the band-shaped regions 18 more proximal to the central portion in the gate-length direction L. Also, in each of the band-shaped regions 18, the arrangement density of the source contacts 28 is lower and the contact surface area between the band-shaped region 18 and the source contacts 28 is smaller more proximal to the central portion in the gate width direction W.

For example, the distribution of the arrangement density of the drain contacts 27 in each of the drain regions 17 and the distribution of the arrangement density of the source contacts 28 in each of the band-shaped regions 18 can be specified by subdividing each region into three imaginary regions along the gate width direction W, etc., similarly to the eighth embodiment.

Effects of the embodiment will now be described.

According to the embodiment, higher uniformity of the temperature can be realized in both the gate-length direction L and the gate width direction W. Otherwise, the configuration and the effects of the embodiment are similar to those of the first embodiment described above.

Tenth Embodiment

Figure 12:
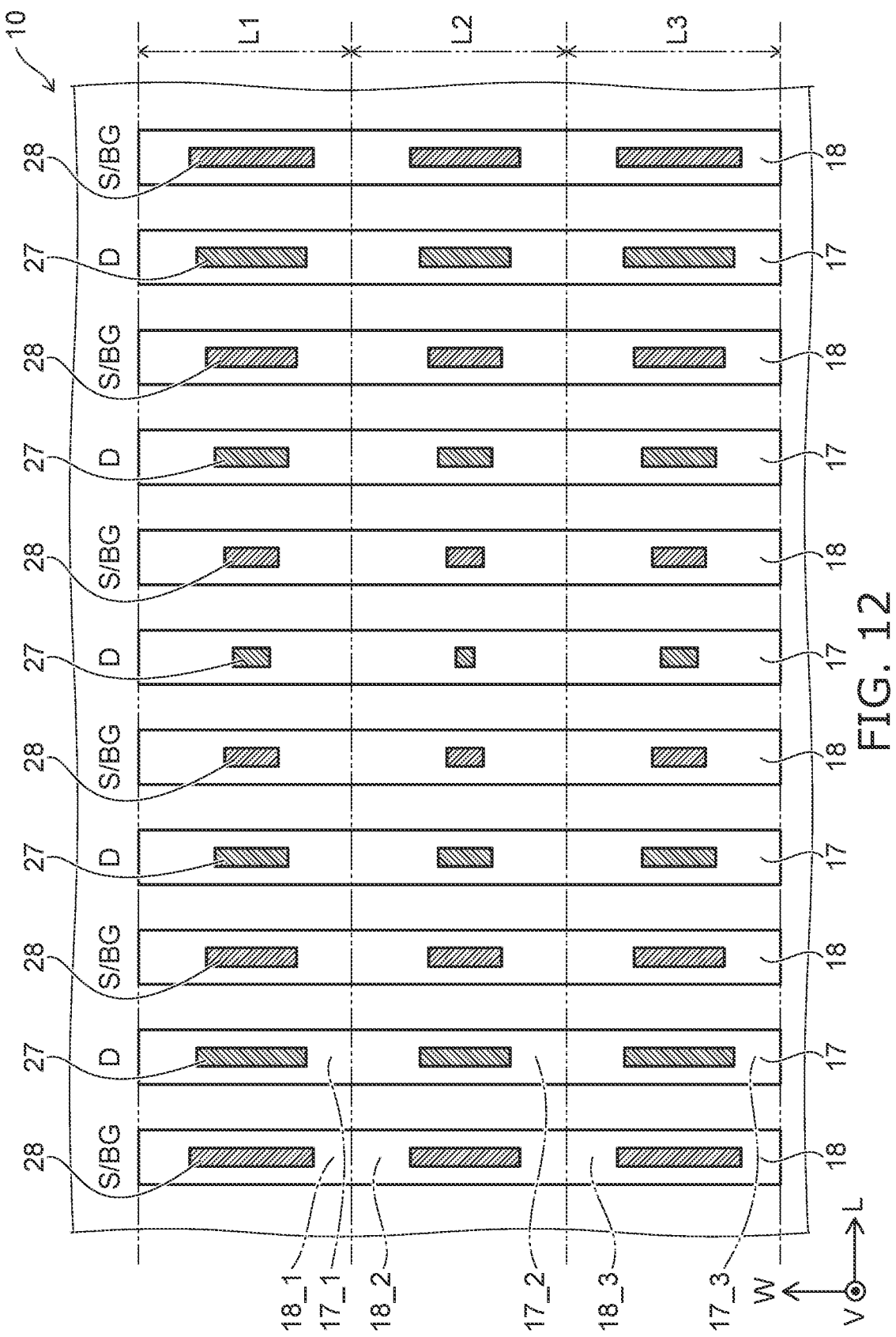
FIG. 12 is a plan view summarily showing a semiconductor device according to a tenth embodiment.

FIG. 12 is a plan view summarily showing a semiconductor device according to the embodiment.

The embodiment is an example in which the ninth embodiment and the fifth embodiment described above are combined.

As shown in FIG. 12, the semiconductor device 10 according to the embodiment differs from the semiconductor device 9 according to the ninth embodiment (referring to FIG. 11) in that the configurations are different instead of the numbers of the drain contacts 27 and the source contacts 28.

In other words, among the multiple drain regions 17 included in the element region, the lengths in the gate width direction W of the drain contacts 27 connected to the drain region 17 are shorter and the contact surface area between the drain region 17 and the drain contacts 27 is smaller for the drain regions 17 more proximal to the central portion in the gate-length direction L. Also, in each of the drain regions 17, the lengths in the gate width direction W of the drain contacts 27 are shorter and the contact surface area between the drain region 17 and the drain contacts 27 is smaller more proximal to the central portion in the gate width direction W.

Similarly, among the multiple band-shaped regions 18 included in the element region, the lengths in the gate width direction W of the source contacts 28 connected to the band-shaped region 18 are shorter and the contact surface area between the band-shaped region 18 and the source contacts 28 is smaller for the band-shaped regions 18 more proximal to the central portion in the gate-length direction L. Also, in each of the band-shaped regions 18, the lengths in the gate width direction W of the source contacts 28 are shorter and the contact surface area between the band-shaped region 18 and the source contacts 28 is smaller more proximal to the central portion in the gate width direction W.

According to the embodiment as well, similarly to the ninth embodiment, higher uniformity of the temperature can be realized in both the gate-length direction L and the gate width direction W. Otherwise, the configuration and the effects of the embodiment are similar to those of the first embodiment described above.

According to the embodiments described above, a semiconductor device that has high heat resistance can be realized.

Although several embodiments of the invention are described hereinabove, these embodiments are presented as examples and are not intended to limit the scope of the invention. These novel embodiments may be implemented in other various forms; and various omissions, substitutions, and modifications can be performed without departing from the spirit of the invention. Such embodiments and their modifications are within the scope and spirit of the invention and are within the scope of the invention described in the claims and their equivalents.

The embodiments described above also can be implemented in combination with each other. For example, although an example is shown in the second to tenth embodiments in which the contact surface area is changed consecutively, this is not limited thereto. For example, as in the first embodiment, the contact surface area may be set to two levels or may be set to three or more levels.

Although the configuration of the drain contact 27 or the source contact 28 is changed by setting the length in the gate width direction W to be different in the fifth, sixth, seventh, and tenth embodiments, this is not limited thereto; for example, the length in the gate-length direction L may be set to be different and/or the diameter when viewed from the vertical direction V may be set to be different.

Although examples are shown in the embodiments described above in which the number or the configuration of the contact is set to be different, both the number and the configuration may be set to be different.

Although examples are shown in the embodiments described above in which a p-channel transistor is formed, an n-channel transistor may be formed. In such a case, the conductivity types of the source region 15 and the drain region 17 are the $n^+$-type; and the conductivity type of the back gate region 14 is the $p^+$-type.

What is claimed is:
1. A semiconductor device, comprising:
a semiconductor layer of a first conductivity type;
a plurality of band-shaped regions extending in a first direction and being provided on the semiconductor layer;
a plurality of drain regions extending in the first direction, being provided on the semiconductor layer, being separated from the band-shaped regions, and being of a second conductivity type;
a gate insulating film provided in a region directly above a region of the semiconductor layer between one of the band-shaped regions and one of the drain regions;
a gate electrode extending in the first direction and being provided on the gate insulating film;
first contacts connected to the band-shaped regions; and
second contacts connected to the drain regions,
each of the band-shaped regions including a back gate region of the first conductivity type, an impurity concentration of the back gate region being higher than an impurity concentration of the semiconductor layer, and a source region of the second conductivity type, an impurity concentration of the source region being higher than the impurity concentration of the semiconductor layer, each of the plurality of band-shaped regions and each of the plurality of drain regions being arranged alternately in a second direction in an element region, a contact surface area between a second region and the second contacts being less than each of a contact surface area between a first region and the second contacts and a contact surface area between a third region and the second contacts when at least one of the drain regions is subdivided into the first region, the second region, and the third region, when the second region is disposed between the first region and the third region in the first direction, and when a length of the first region, a length of the second region, and a length of the third region in the first direction are set to be equal to each other, at least one second contact connected to the second region having a contact surface area smaller than each of at least one second contact connected to the first region and at least one second contact connected to the third region, among the plurality of drain regions, a contact surface area between the second contacts and one of the plurality of drain regions most proximal to a central portion of the element region in the second direction being less than a contact surface area between the second contacts and one of the plurality of drain regions disposed on an outermost side of the element region in the second direction, and at least one second contact connected to the one of the drain regions most proximal to the central portion having a contact surface area smaller than at least one second contact connected to the one of the drain regions disposed on the outermost side.

2. The device according to claim 1, wherein a contact surface area between a fifth region and the first contacts is less than a contact surface area between a fourth region and the first contacts and a contact surface area between a sixth region and the first contacts when at least one of the band-shaped regions is subdivided into the fourth region, the fifth region, and the sixth region, when the fifth region is disposed between the fourth region and the sixth region in the first direction, and when a length of the fourth region, a length of the fifth region, and a length of the sixth region in the first direction are set to be equal to each other.

3. The device according to claim 1, wherein the back gate region and the source region are arranged alternately along the first direction in the band-shaped region.

4. A semiconductor device, comprising:

a semiconductor layer of a first conductivity type;

a plurality of band-shaped regions extending in a first direction and being provided on the semiconductor layer;

a plurality of drain regions extending in the first direction, being provided on the semiconductor layer, being separated from the band-shaped regions, and being of a second conductivity type;

a gate insulating film provided in a region directly above a region of the semiconductor layer between one of the band-shaped regions and one of the drain regions;

a gate electrode extending in the first direction and being provided on the gate insulating film;

first contacts connected to the band-shaped regions; and second contacts connected to the drain regions, each of the band-shaped regions including a back gate region of the first conductivity type, an impurity concentration of the back gate region being higher than an impurity concentration of the semiconductor layer, and a source region of the second conductivity type, an impurity concentration of the source region being higher than the impurity concentration of the semiconductor layer, each of the plurality of band-shaped regions and each of the plurality of drain regions being arranged alternately in a second direction in an element region, a contact surface area between a second region and the first contacts being less than each of a contact surface area between a first region and the first contacts and a contact surface area between a third region and the first contacts when at least one of the band-shaped regions is subdivided into the first region, the second region, and the third region, when the second region is disposed between the first region and the third region in the first direction, and when a length of the first region, a length of the second region, and a length of the third region in the first direction are set to be equal to each other, at least one first contact connected to the second region having a contact surface area smaller than each of at least one first contact connected to the first region and at least one first contact connected to the third region, among the plurality of band-shaped regions, a contact surface area between the first contacts and one of the plurality of band-shaped regions most proximal to a central portion of the element region in the second direction being less than a contact surface area between the first contacts and one of the plurality of band-shaped regions disposed on an outermost side of the element region in the second direction, and at least one first contact connected to the one of the band-shaped regions most proximal to the central portion having a contact surface area smaller than at least one first contact connected to the one of the band-shaped regions disposed on the outermost side.

5. The device according to claim 4, wherein the back gate region and the source region are arranged alternately along the first direction in the band-shaped region.

6. The device according to claim 4, further comprising:

an element-separating insulating film provided between the drain region and the source region, the element-separating insulating film contacting the drain region but not contacting the source region; and a drift region provided in a region directly under the element-separating insulating film, the drift region being connected to the drain region and being of the second conductivity type, an impurity concentration of the drift region being lower than an impurity concentration of the drain region.

* * * * *